United States Patent
Castellanet

(10) Patent No.: US 10,780,960 B2
(45) Date of Patent: Sep. 22, 2020

(54) ELECTRONIC DEVICE FOR DIVING EQUIPMENT

(71) Applicant: LETSACT, Saint Nom la Breteche (FR)

(72) Inventor: Frederic Castellanet, Paris (FR)

(73) Assignee: LETSACT, Saint Nom la Breteche (FR)

( * ) Notice: Subject to any disclaimer, the term of this patent is extended or adjusted under 35 U.S.C. 154(b) by 1326 days.

(21) Appl. No.: 14/424,449

(22) PCT Filed: Aug. 22, 2013

(86) PCT No.: PCT/FR2013/051955
§ 371 (c)(1),
(2) Date: Feb. 27, 2015

(87) PCT Pub. No.: WO2014/033391
PCT Pub. Date: Mar. 6, 2014

(65) Prior Publication Data
US 2015/0210367 A1    Jul. 30, 2015

(51) Int. Cl.
*B63C 11/08* (2006.01)
*B63C 11/04* (2006.01)
(Continued)

(52) U.S. Cl.
CPC .............. *B63C 11/04* (2013.01); *B63C 11/08* (2013.01); *F04D 13/08* (2013.01); *H02J 7/0063* (2013.01);
(Continued)

(58) Field of Classification Search
CPC .......... A61M 16/00; A61M 16/20–209; A61M 16/06–0694; A61M 16/003–0015;
(Continued)

(56) References Cited

U.S. PATENT DOCUMENTS 5,365,868 A * 11/1994 Culotta ................. A63B 35/12
114/315
5,423,586 A * 6/1995 Fuller ...................... A45C 3/00
294/149

(Continued)

FOREIGN PATENT DOCUMENTS

DE         19914380 A1    10/2000
DE      202011101153 U1    8/2011

OTHER PUBLICATIONS

International Search Report, dated Oct. 30, 2013, from corresponding PCT application.

*Primary Examiner* — Michael J Tsai
*Assistant Examiner* — Ned T Heffner
(74) *Attorney, Agent, or Firm* — Young & Thompson

(57) ABSTRACT

The device (50) includes at least one electronic circuit (52) and a battery (53) provided for powering the circuit, wherein the circuit and the battery are included in a block of hydrophobic material, for example a block of resin (51). The battery is, for example, an inductively charged battery and the device can include optical sockets (56a, 56b, 56c) for fiber-optic cables, so as to avoid all contact of metal parts with water. Such a device is especially suitable for a buoyancy compensator vest, for use as a "stabilizer during immersion" and as a "closed-circuit rebreather".

18 Claims, 4 Drawing Sheets

(51) Int. Cl.
    *H02J 50/10*     (2016.01)
    *H05K 5/06*     (2006.01)
    *F04D 13/08*     (2006.01)
    *H02J 7/00*     (2006.01)
    *B63C 11/02*     (2006.01)

(52) U.S. Cl.
    CPC ............... H02J 50/10 (2016.02); H05K 5/06 (2013.01); H05K 5/065 (2013.01); *B63C 2011/021* (2013.01); *B63C 2011/085* (2013.01)

(58) Field of Classification Search
    CPC . A61M 2016/0015–0042; A62B 18/00; A62B 7/00; A62B 89/00; B63C 11/12; B63C 11/08
    See application file for complete search history.

(56) References Cited

U.S. PATENT DOCUMENTS

| | | | |
|---|---|---|---|
| 6,694,911 B1 | 2/2004 | Gallagher et al. | |
| 6,895,961 B1 * | 5/2005 | Todorov | A62B 19/00 128/201.27 |
| 2006/0270471 A1 * | 11/2006 | Matthiessen | H04L 12/403 455/575.6 |
| 2010/0064827 A1 * | 3/2010 | Dakin | B63C 11/32 73/865.1 |
| 2011/0240018 A1 * | 10/2011 | Dunn | B63C 11/26 128/202.13 |
| 2012/0132207 A1 | 5/2012 | Straw | |

* cited by examiner

ELECTRONIC DEVICE FOR DIVING EQUIPMENT

BACKGROUND OF THE INVENTION

Field of the Invention

The invention is situated in the field of electronic devices operating in a hostile environment, in particular the marine environment, suitable in particular to diving equipment.

Some activities require the use of electronic devices in a marine environment, for example diving equipment. However sea water is a highly conductive environment and it is essential to avoid any contact between the electronics and the sea water.

Description of the Related Art

One known solution for sheltering an electronic circuit from sea water is to enclose it in a sealed container or box and to use sealed connectors for the connecting cables. However, absolute and permanent watertightness, both for the container and the connectors, is difficult to guarantee. In addition, the container has a volume and mass that are not very compatible with an individual activity such as diving.

BRIEF SUMMARY OF THE INVENTION

The invention proposes to solve these difficulties. To this end, it proposes a device for a diver having at least one electronic circuit and a battery designed to supply said circuit, in which the circuit and battery are included in a block of hydrophobic material.

A hydrophobic material is insensitive to water, non-conductive and non-oxidisable. The inclusion block may consist of at least two shells applied to each other and comprising a gasket at the periphery, which makes it possible to open the device and to work on the circuit or battery, but advantageously, it is made as a single piece.

Advantageously, the device may further comprise at least one actuator included in said block of hydrophobic material, controlled by said electronic circuit and supplied by said battery.

In general terms, an actuator is a member capable of executing work ordered by a remote control unit. Examples of actuators are an electric motor, a ram, an electromagnet, a piezoelectric ceramic, etc.

Since the majority of actuators are sensitive to sea water, it is particularly advantageous that the actuator or actuators used in the invention are also included in the block of hydrophobic material.

Advantageously, the block of hydrophobic material may be a block of resin, for example a dual-component resin polymerisable by means of a hardening component. Polymerisable resins are known for their insensitivity to water.

The advantage of a block of polymerised resin is also its low weight (an almost zero relative weight in sea water) and its small size.

When the electronic circuit is embedded in a block of resin it is no longer possible to work thereon, but on the other hand since resin is not conductive it remains possible to reprogram a microprocessor or to fill a memory by electromagnetic waves or by optical link.

Advantageously, the battery may be of the type that may be recharged without electrical contact, in particular an inductive charging battery.

Metal sockets of the type for an external charger, which are liable to create water ingresses and short-circuits, are thus avoided. Because the battery is included in the block of hydrophobic material, water ingresses that could occur in an insufficiently sealed battery compartment are also avoided.

Advantageously, the device may also comprise a control panel.

This control panel constitutes a means of dialoguing between the device and the diver. It may be situated on the device itself or preferably be offset from the block of hydrophobic material.

Advantageously, the device may further comprise means of communication between said electronic circuit and said control panel.

When the control panel is separate from the block of hydrophobic material, it is advantageous for the device to comprise means of communication between them, making it possible to transmit information and/or to receive commands from the diver, these communication means being disposed on the surface of or inside the block and panel.

When it is offset from the block, the control panel is for example carried on the wrist of the diver.

Advantageously, the communication means may comprise at least one means for transmitting/receiving optical and/or radio and/or acoustic-wave signals.

These communication means are insensitive to sea water. Since sea water is a conductive medium, radio waves do not propagate well therein but, over short distances some radio frequencies, lying between 30 and 40 kHz, may be used.

Advantageously, the means for transmitting/receiving optical signals may comprise at least one optical socket provided for connecting an optical-fibre cable thereto.

Optical signals may propagate in water over short distances, but it is preferable to use optical-fibre cables for transporting these signals.

The device therefore comprises not metal and/or electrical sockets for the transmission and reception of signals from the outside, but optical sockets, procuring means of connection to the end sockets of optical cables and not comprising any electrical contact.

The device according to the invention is therefore intrinsically insensitive to water:
- the electronic circuit is entirely surrounded by the material, which shelters it from attacks from the marine environment,
- the battery is recharged by induction; because of this, there is no socket on the device for connecting a charger, which could constitute an entry for water,
- the signal inputs and outputs (commands, measurement values, etc.) are done by means of optical fibres connected to the block of material or radio waves; it does not comprise any socket for connecting electrical cables that would have a sealed connector at their end.

Advantageously, the device may further comprise a pressure and/or temperature sensor.

These sensors are integrated in the block of resin so as not to constitute an entry door for sea water in the device. The pressure sensor will be useful in stabilisation applications in submersion described below.

Advantageously, the actuator of the device may comprise at least one motor driving a compressor, said compressor comprising a channel in said block of material, the rotor of said motor being housed inside said channel, the stator being embedded in said block of material.

In an application to stabilisation of the diver in submersion, the electronic device may be used to inflate or deflate a bag of gas, the corresponding command having been supplied by means of the control panel described above. In this case, it is advantageous for a motor driving a compressor, for example a screw compressor, to be integrated in the block of resin of the device. Such a compressor may then comprise a channel in the block of resin, intended to receive the gas to be driven, this gas being conducted by ducts connected sealingly to the block of resin. The motor may comprise a rotor in this channel for driving the gas, this motor being rotated by a stator embedded in the block of resin and supplied with energy by the battery of the electronic device. Since this compressor is designed to circulate respirable air, it should be an oil-free compressor.

Advantageously, the actuator may comprise a valve or shutter designed to be remotely controlled.

If the gas used for inflating a stabilisation bag is supplied by a pressurised gas bottle, it only requires for the bottle and bag to be connected to the device and for a valve or shutter, the opening and closing of which can be controlled remotely by the electronic circuit, for example motorised, included in the block of resin, to enable gas to pass by opening.

The invention also relates to a lost-air stabilising jacket for a diver, comprising a device according to the invention connected firstly to a respiration gas bottle and secondly to at least one bag on said stabilising jacket by gas pipes.

A diver stabilising jacket (or "stab") enables the diver to adjust his submersion and/or speed of descent or ascent: in descent, once he has arrived at the required depth, the diver slightly inflates the bag or bags on his "stab" in order to achieve equilibrium at this depth. Subsequently, inflation of the "stab" causes the diver to ascend and deflation thereof stops such ascent.

The "stab" inflates either by mouth, or by taking from the respiration compressed air bottle when the "stab" is directly connected to the bottle. It then functions in lost-air mode since, during deflation of the bag or bags, the gas escapes into the water.

The device comprises a pressure sensor and at least one compressor or motorised valve, connected by gastight gas pipes firstly to the respiration gas bottle, provided with a pressure reducing valve, and secondly to at least one gas bag of a stabilising jacket. If the jacket comprises several bags grouped at locations on the jacket (for example at the chest of the driver, his back or his shoulders), it will be advantageous for the device to comprise one compressor per group of bags (for example one compressor for the front bags, one for the rear bags, one for the shoulder bags) so as to individualise the inflation of the bags according to the position of the diver or the command; for example, the bags situated at the shoulders of the user provide for his ascent in the vertical position.

More simply, the passage of the air from the compressed air bottle to the bags can be done through a motorised valve or shutter.

The bags do not need to be provided with shutters, since the compressors or valves are designed to maintain the gastightness of the bags.

In the bag-emptying direction, the air escapes from the compressors through a valve. It is necessary for the air to be able to escape from the bags in all positions of the diver, in particular with his head downwards. To this end, it is advantageous for the air discharge means to be disposed at each corner of the bags. For example, the air discharge duct may travel over the internal wall of the bag and be provided with openings along one or more generatrices.

The invention also relates to a recycled-air stabilising jacket for a diver, which may comprise a device according to the invention, connected firstly to a gas bottle for stabilisation and secondly to at least one bag on said stabilising jacket through gas ducts.

In this case the gas used for stabilisation is not taken from the gas bottle intended for respiration; it comes from a dedicated bottle. In addition, it is not lost during the deflation of the bag or bags; it is returned to this dedicated bottle by means of the compressor. It is in this case a small bottle, for example half a litre, inflated to a pressure much lower than that of the respiration air bottle, compatible with the power of the compressor, for example 20 bar.

Advantageously, in this application to stabilisation, the control panel of the device of the stabilising jacket may comprise an optical switch for activating/deactivating a stabilisation function at the expected submersion of the device.

Advantageously, the control panel may further comprise at least one optical switch for activating/deactivating respectively at least one of the following functions of the device:
  slow ascent,
  rapid ascent,
  slow descent,
  rapid descent,
  pause.

Optical switch means a control device comprising at least two optical fibres, disposed in this device so that light is transmitted from one fibre to the other only when an object is applied to the switch. "At rest" the switch is open, and closes only when an object (for example the finger of the diver) is applied, causing the transmission to the electronic device of the command associated with this switch. Alternatively, it is possible to provide that at rest the switch is closed and that the finger of the user opens the optical circuit.

To avoid wrong manoeuvres, it is possible to provide for the command to be executed only if the user keeps his finger on the switch for a certain length of time, for example one second, or confirms his command by a second application of his finger, either to the same switch or to a validation switch. It is also possible to provide for the execution of the command to be indicated by a change in colour of the optical switch.

According to the instructions given by the diver by means of these optical switches, the device controls either the submersion depth or the speed of ascent or descent of the diver.

This relieves the diver from having to monitor his submersion or rate of descent or ascent; he gives his instructions by means of the control panel. The instruction and the pressure at which the diver is situated are processed by the electronic circuit that controls the motors of the compressors or valves. Control exercised by an electronic device is advantageous; it makes it possible for example to avoid exceeding a limit depth or rate of ascent.

Naturally, the diver, fully equipped, must have a slightly negative buoyancy when the bags are empty (that is to say he must have a tendency to descend), this buoyancy being adjusted by lead ballasts, these ballasts being able to fit in suitable pockets on the jacket.

The Pause function consists of pausing the system regulating the depth, while the diver himself maintains his submersion depth, for example by breathing in, which makes him ascend slightly, or by breathing out, which makes him descend slightly.

The invention also relates to a closed-circuit recycler for a diver, comprising a device according to the invention.

In an application to closed-circuit breathing apparatus, the device measures and controls the partial pressure of oxygen of the mixture breathed by the diver and adjusts the admission of pure oxygen so that this partial pressure remains within an acceptable range.

BRIEF DESCRIPTION OF THE DRAWINGS

Embodiments and variants will be described below, by way of non-limitative examples, with reference to the accompanying drawings, in which.

DETAILED DESCRIPTION OF THE PREFERRED EMBODIMENTS

Figure 1:
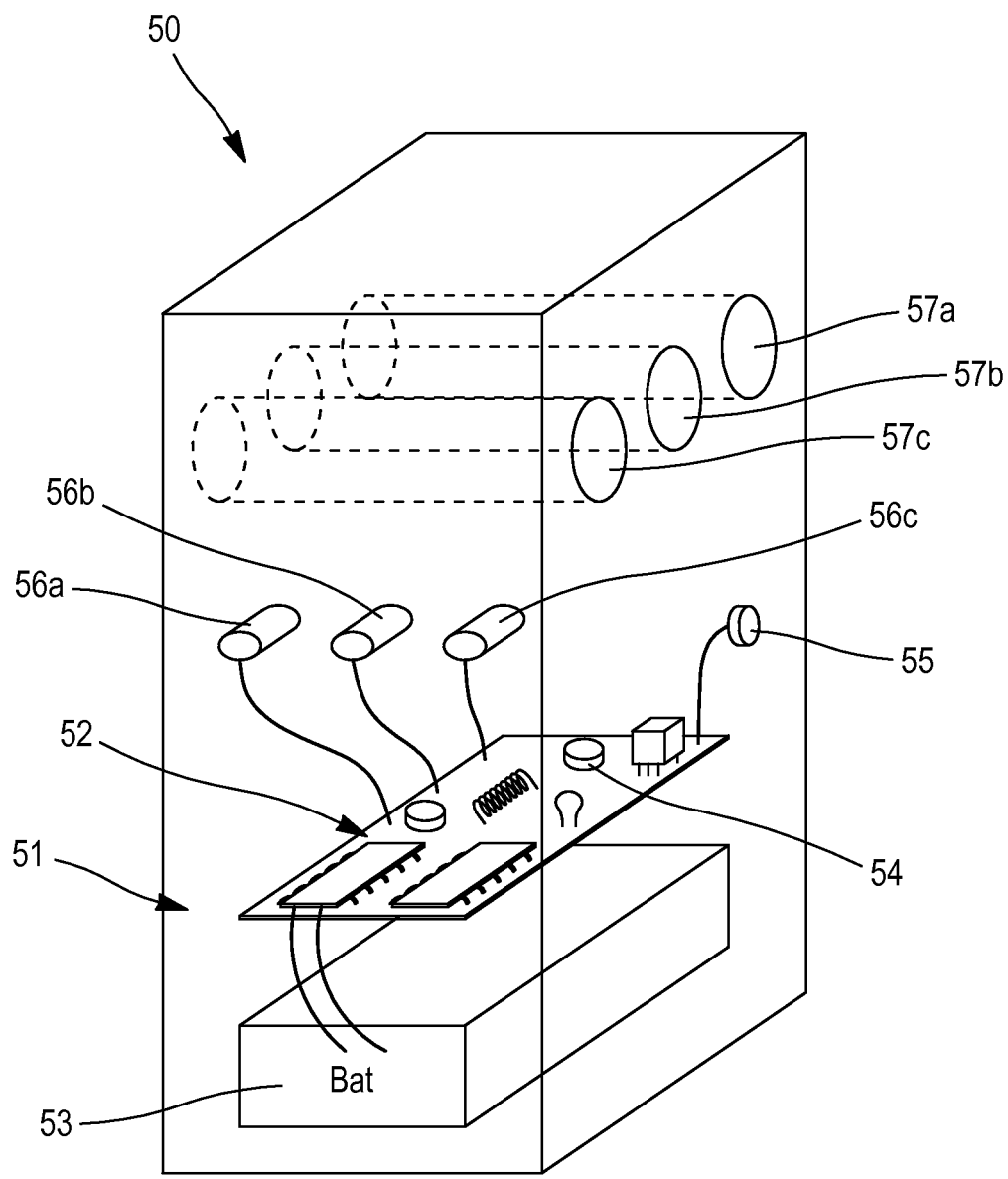
FIG. 1 illustrates schematically a device according to the invention.
Figure 2:
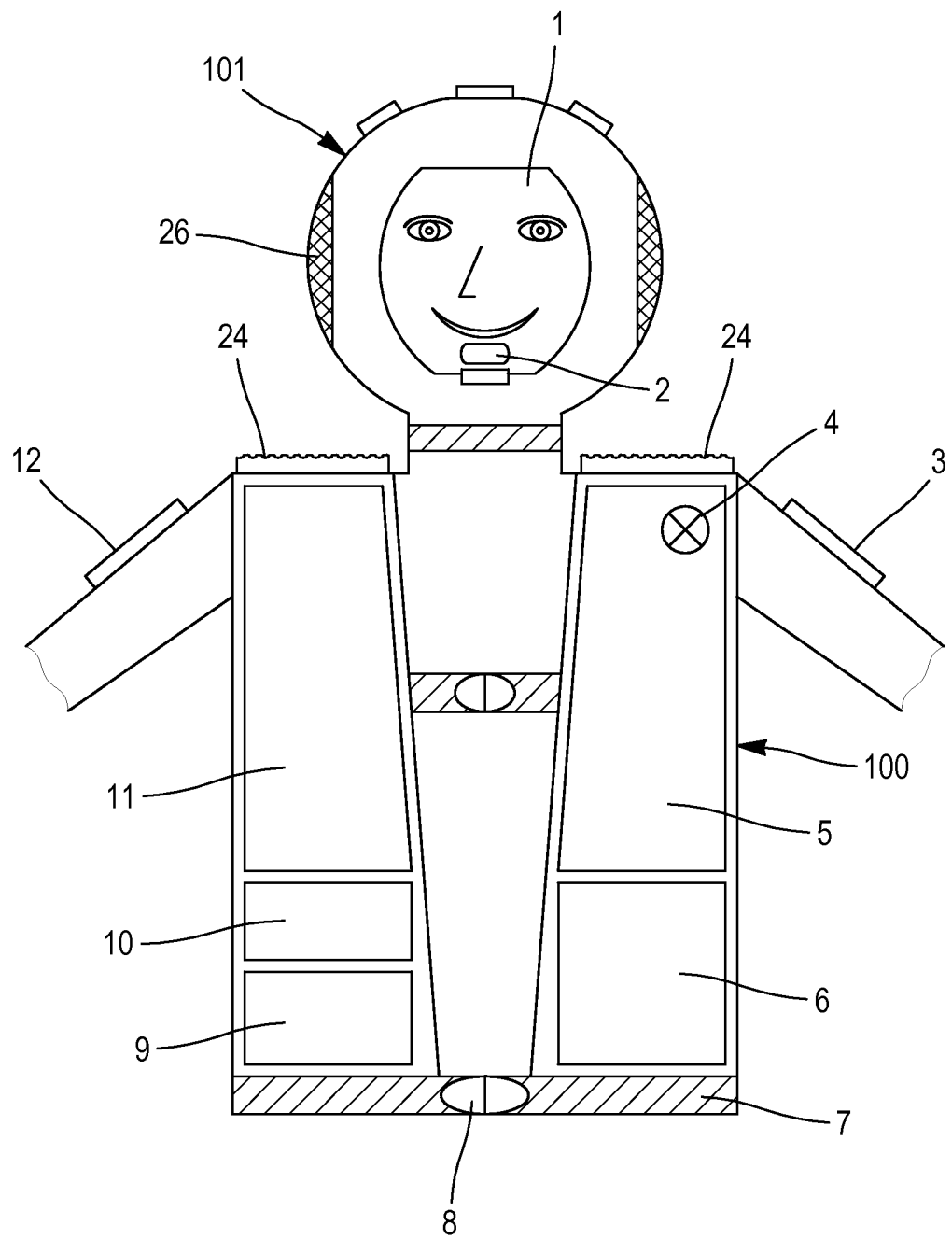
FIG. 2 illustrates schematically the chest of a diver equipped with a closed-circuit diving jacket, in front view.
Figure 3:
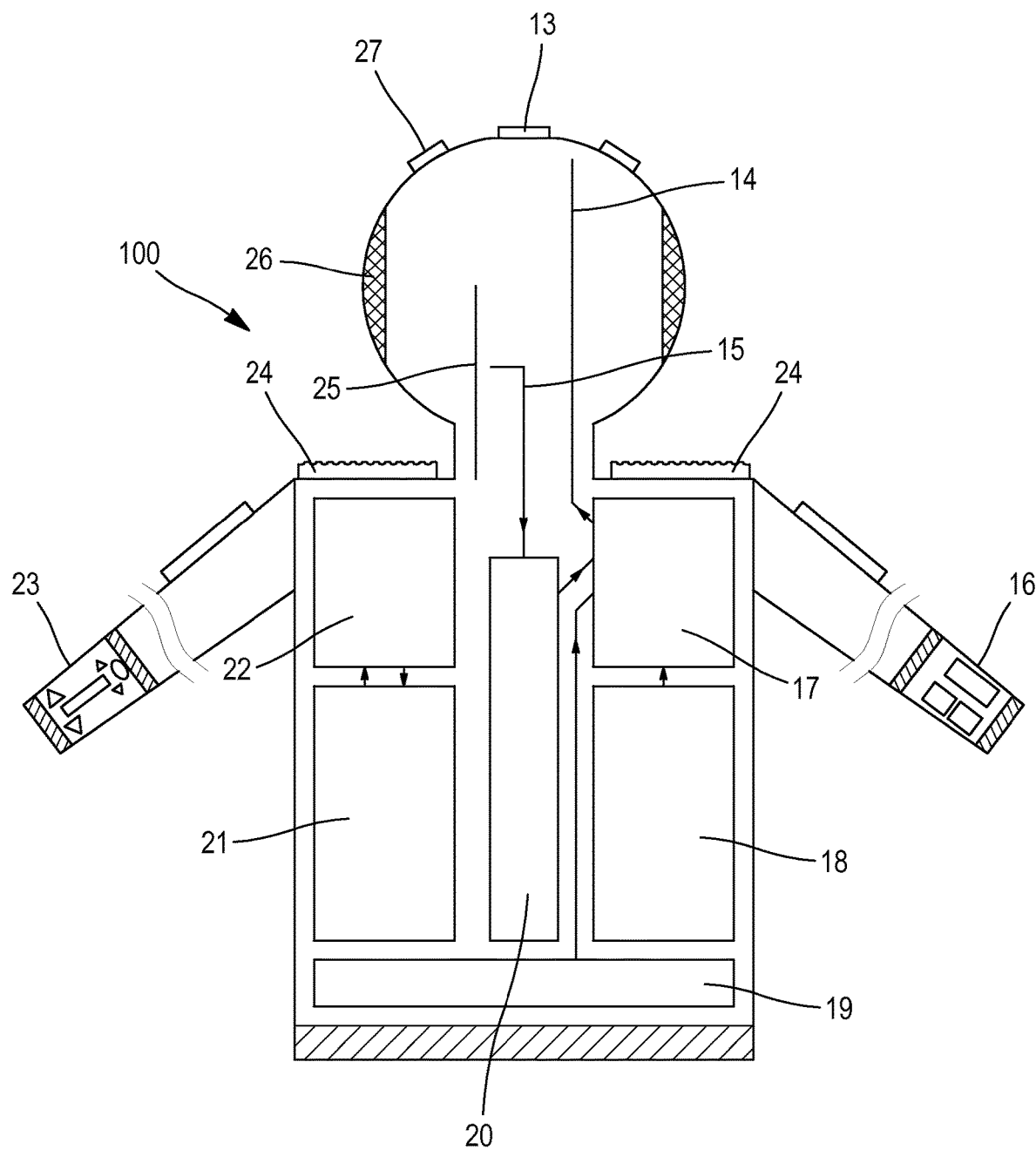
FIGS. 3 and 4 illustrate schematically the diving jacket, seen from the back.
Figure 4:
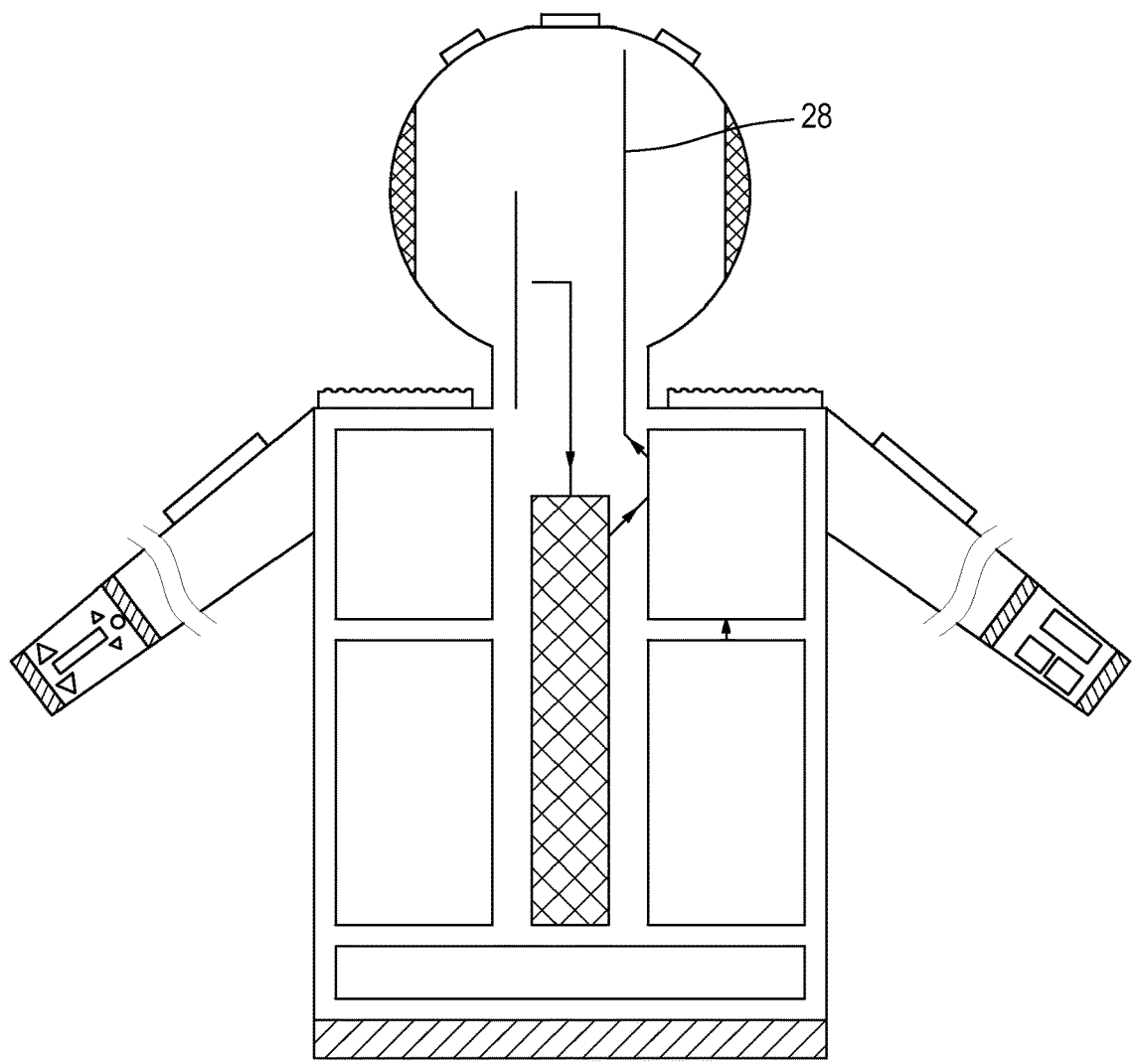
Figure 5:
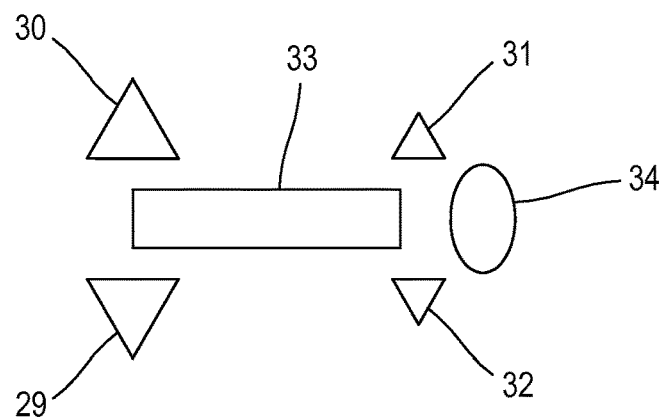
FIG. 5 illustrates an enlarged view of the stabilisation and ascent/descent control panel.

FIG. 1 illustrates an electronic device 50 according to the invention. The device 50 comprises, embedded in a block of resin 51 and seen in transparency in this block:

- an electronic circuit 52 of conventional design, mounted on an electronic card; the detailed constitution of this electronic circuit depends on the function fulfilled by the device, but generally comprises at least one microprocessor 52a,
- an inductive charging battery 53 designed to supply the device with electricity,
- a pressure sensor 54 connected to the electronic circuit 52, the sensor of which does not need to be in contact with water since the resin transmits the pressure to this sensor; it may be mounted directly on the electronic card,
- a temperature sensor 55 connected to the electronic circuit 52, the sensor of which is advantageously placed close to one face of the block of resin, inside this block, in order to prevent any contact between the sensor and sea water,
- optical sockets 56a, 56b, 56c emerging on one face of the block of resin 51 and connected by optical fibre to the electronic circuit 52; alternatively, provision can be made for the optical-fibre cables to emanate directly from the block of resin 51,
- compressors, valves or shutters housed in channels 57a, 57b, 57c that pass through the block of resin 51.

FIGS. 2 to 5 illustrate two applications of an electronic device according to the invention to a diving jacket.

Basic Equipment: The Recycling-Type Diving Jacket

The jacket 100 according to the invention comprises at least two electronic control devices as described above, one for stabilisation in submersion, the other for the closed-circuit recycler, each comprising an electronic circuit and a battery included in a block of resin.

The jacket put on like a normal jacket but is characterised by pockets, each containing either a gas bottle, or an inflatable bag, or an electronic device, or a bag containing a $CO_2$ absorbent. It may also comprise a helmet 101.

The jacket is provided with a network of optical fibres and a network of flexible gas ducts. The optical fibres convey information and the ducts a respirable mixture up to 4 bar.

The jacket comprises open pockets and pockets that are closed, for example by adhesive bonding or welding.

The open pockets of the jacket contain:
- in the back, an electronic device 17, a pure-oxygen bottle 19 at 200 bar with a capacity of approximately 3 litres, a flexible bag of $CO_2$ absorbent 20, for example lime, the lime having to be changed regularly,
- on the front of the jacket, an emergency set 6 comprising a compressed-air bottle with pressure reducing valve for supplying the nozzle 2 on the helmet in an emergency.

The closed pockets are protected by Kevlar or another untearable fabric. They contain:
- on the front of the jacket, a false lung 5 of the closed-circuit recycler and, at chest level, a balancing bag 11 allowing ascent, descent and stabilisation
- on the shoulders, bags 24 allowing ascent.

Stabilisation and Ascent/Descent Function

In a conventional dive, the diver ascends and descends by manually inflating and deflating a stabilising bag (or "stab") and refines his submersion by inflating and deflating his lungs (ballast lungs). Here, as the diver is not ejecting air, the ballast lung manoeuvre has no effect. The assembly is therefore replaced with inflatable bags housed in closed pockets of the jacket.

Four inflatable bags are placed at chest level, two in front, two behind (only one, reference 11, is depicted) in order to stabilise submersion and for ascent or descent.

In addition, two inflatable bags 24 intended to give additional buoyancy for rapid ascent are placed on the shoulders. They are placed on the shoulders in order to force an inexperienced diver to ascend with his head upwards.

A control panel 23 comprising control buttons in the form of optical stabilisation and ascent/descent switches 29 to 34 is placed on the left wrist. It is connected to the electronic stabilisation and ascent/descent device 22 by optical-fibre cables so as not to have any flow of electric current.

Two compressors are placed in the electronic ascent/descent device 22 making it possible as required to communicate air coming from one or more compressed-air bottles 21 at 20 bar and the inflatable bags 11, 24 under local pressure. These compressors are embedded in the same resin as the electronic control circuit and the battery. In this way there is no electrical connector in contact with water. The battery is recharged by induction for this same reason.

For reasons of safety all the equipment is duplicated: the rapid ascent/descent optical-fibre network is separated from the slow ascent/descent network. The electronic systems are also duplicated with a master system as in the space industry. All the systems of conduits and network of fibres are protected from impacts and tears by an untearable fabric of the Kevlar type or metal shells.

The slow ascent/descent instruction inflates only the balancing bags located at lungs level. The rapid ascent/descent instruction in addition inflates the bags 24 located at shoulder level. This makes it possible to have two completely independent circuits and, if an ascent network fails, the other, which is valid, makes it possible to ascend gently.

The optical controls comprise a light-conveying network that illuminates the buttons continuously. Two functioning are envisaged: when the finger is brought close, either this reflects part of the light into another fibre, which sends the instruction, or this cuts off the light circuit between two fibres and is such cutting off gives the instruction.

Balancing of the Ears

During descent, the pressure of the water on the external face of the eardrum increases and diverges from the pressure on the internal face, which may cause intense pain. To balance the ears the "Valsalva's manoeuvre" is for example performed: the diver pinches his nose and blows strongly into it, which balances the pressure on either side of the eardrum, and this manoeuvre is repeated throughout descent.

In order to avoid learning of this manoeuvre and to be able to make a larger mask, the jacket helmet incorporates two small inflatable bags 26 on the ears. Carrying out pressure/negative pressure cycles in these bags assists balancing of the ears. These cycles can be created by a small ram or a flexible membrane in the air circuit. Care will be taken to remain outside the audible region (20 Hz-20,000 Hz). These inflatable bags are controlled by a dedicated button 35 on the control panel 23.

Closed-Circuit Recycler Function

The basic principle of the jacket according to the invention is that of diving with a closed-circuit recycler. The air expired by the diver is sent into a bag 20 of absorbent that absorbs the $CO_2$ and allows the unused dioxygen to pass. The $CO_2$ absorbent (lime or the like) is contained in a flexible bag 20 housed along the vertebral column. In this way the movements of the diver mix the lime, preventing the creation of preferential passages.

Additional pure oxygen contained in a small bottle 19 is added to the air that has passed through the bag of absorbent. The partial pressure of oxygen in the mixture is monitored continuously by means of sensors and the electronic device 17 dedicated to this function.

The percentage of oxygen is calculated according to the depth but also according to the state of the diver, in particular his pulse or other physiological data denoting a state of lack (pupil etc.) or indication of emergency ascent.

The use of a helmet enclosing the mouth and nose in which an air flow suited to the depth and temperature is established and regulated not only makes use for a beginner diver easier but also avoids adding a buffer tank to the system.

All the data on the physiological state and the gaseous compositions are conveyed by optical fibres. For this purpose the measuring diodes (% of oxygen by laser diode in particular, etc.) will be housed in the electronic device comprising the electronics and the battery so that no electrical current or signal circulates outside the block of resin.

All the electronics and sensors are duplicated with a master processor in order to determine which system to trust. The networks of optical fibres and ducts of the electronic devices 17 and 22 are protected from tears by Kevlar or equivalent.

Dive Information Panel 16

The information on the state of the diver are generated by an electronic device controlling the mixture 17 and transmitted to the right wrist by an optical-fibre network. There are no electronics on the wrist, only a spreading of the optical fibres in the conventional bitmap display matrix.

The remaining dive time is calculated to the worst possible case: this is the time remaining at the current depth at least thirty minutes before ascent and the levelling-off spot.

Emergency Function

The jacket incorporates a small compressed-air bottle 6 at 200 bar, a pressure reducing valve and a conventional nozzle 2 so as to be able to ascend and implement the safety decompression stop if the electronic devices are or appear faulty.

During ascent, if the electronic ascent device 22 is not touched, recommendations will be issued for the attention of the diver ("do not forget to breathe out, do not ascend more quickly than the ascender makes you, etc.").

An intermittent sound as well as lights will indicate to the other divers that an emergency ascent is being made.

Emergency Ascent Button

In the event of panic the diver can press on a button of the "emergency stop" type 4 triggering an emergency ascent. This button is situated on the right shoulder and connected to the network of control optical fibres.

In this case the mixing system will enrich the respiratory mixture with oxygen, the helmet will be illuminated with a calming light and safety instructions will be given ("do not swim, remain vertical, etc."). The ascent system will trigger a rapid ascent; if the physiological conditions are met (not excessively deep or excessively long dive in particular), no safety decompression stop will be implemented.

Camera or Photographic Apparatus Option

The lens of the photographic apparatus or camera 13 is disposed on the top of the helmet with the microphone. The flash or flashes 27 is/are disposed on the helmet between the lens and the ears. This makes it possible not to have direct illumination of the particles in suspension in the water and therefore images. Sound waves are captured alongside the lens and are retransmitted by a tube as far as the vision electronics 3.

The optical-fibre network shows, inside the helmet, the region photographed and the settings would be optimised for conventional shots as with all current compact cameras. The electronics of the apparatus will be embedded in the resin with its induction-rechargeable battery.

The light will be transmitted form the lens to the photographic apparatus or camera by the optical fibres. The light or the flash likewise. These fibres will not be protected by Kevlar.

Guidance or Commentary Options

These options will be implemented in the same way as the "photographic apparatus" functions: recovery of the information by lens and optical fibres, projection in the mask by optical fibres, processing in electronics embedded in the resin and supplied by a battery embedded in the same block of resin and recharged by induction.

"Guidance option" the diving sites are almost all known and mapped. Knowing the starting point by GPS before descent, optical recognition makes it possible to situate oneself and to know where to go according to the main points of interest on the site. When a diver sees something new, the depth and place are known; if the diver photographs this thing and then connects to a dedicated website, the photograph and its coordinates will then be added to a databank constantly updated for the next divers.

"Commentary" option: before the start of the diving, it is possible to load a database containing the description of the majority of living species at the place where the dive is going to be carried out. During the dive a blink detector triggers the optical recognition software, which then displays, by projection in the helmet, the names and characteristics of the animal or plant recognised. The optical recognition functions continuously in order to warn the diver of a potential danger. If the software recognises a dangerous animal or plant, it will display the characteristics thereof in the helmet and optionally trigger slight inflation of the bags in order to move the diver away from it.

GPS and Radio Call to the Boat Option

The GPS and radio antennas 25 are at neck height in the helmet. The systems activate automatically when leaving the water (pressure=starting atmospheric pressure). Same implementation as the rest of the electronic equipment with the antenna connectors embedded in the resin like the electronics and the battery.

REFERENCES

1 Head-up display
2 Emergency nozzle

3 Vison electronics
4 Emergency ascent button
5 Respirator false lung
6 Emergency assembly
7 Elastic belt
8 Belt loop
9 Electronics, GPS, radio
10 Pocket for lead weights
11 Balancing bag for ascent/descent
12 Photo and films electronics
13 Photographic apparatus or camera
14 Pure-air duct (helmet inlet)
15 Vitiated air duct (helmet outlet)
16 Information panel on dive and pulse readings
17 Electronic device comprising electronics for producing and monitoring the respirable mixture
18 Respirable compressed-air bottle (diluent) (200 bar)
19 Oxygen bottle
20 Flexible bag of lime
21 Compressed-air bottle for ascent/descent (20 bar)
22 Electronic device comprising electronics for stabilising and ascent/descent
23 Ascent/descent control panel
24 Inflatable bags for rapid ascent
25 GPS and radio antenna
26 Vibrating part for ears
27 Flash or torch
28 Part covered with Kevlar
29 Rapid-descent button
30 Rapid-ascent button
31 Slow-ascent button
32 Slow-descent button
33 Stabilisation button
34 Pause button
35 Ear vibration button
50 Electronic device
51 Block of resin
52 Electronic circuit
52a Microprocessor
53 Battery
54 Pressure sensor
55 Temperature sensor
56a, 56b, 56c Optical sockets
57a, 57b, 57c Compressor ducts
100 Jacket
101 Helmet

The invention claimed is:

1. A device (17, 22) for a diver, comprising:
a block of hydrophobic material; and
at least one electronic circuit (52) and a battery (53) designed to supply said circuit,
wherein said circuit and said battery are included in said block of hydrophobic material,
wherein said device further comprises at least one actuator included in said block of hydrophobic material, controlled by said electronic circuit (52) and supplied by said battery (53),
said block of hydrophobic material includes a first external face and an opposite, second external face, and a duct (57a, 57b, 57c) that passes through said block of hydrophobic material through the first external face, to and through the opposite, second external face, and
said actuator is a motor driving a compressor, said compressor comprising the duct (57a, 57b, 57c) in said block of hydrophobic material (51), a rotor of said motor being housed inside said duct, a stator of said motor being embedded in said block of hydrophobic material.

2. The device according to claim 1, wherein said block of hydrophobic material is a block of electrically non-conductive polymerized resin.

3. The device according to claim 1, wherein said battery is of the type that may be recharged without electrical contact.

4. The device according to claim 1, wherein said battery is of the inductive-charging type for inductive charging through at portion of the block of hydrophobic material.

5. The device according to claim 1, further comprising a temperature sensor (55) located within said block of hydrophobic material and wherein, with the device located in sea water, the temperature sensor is free of any contact with sea water.

6. The device according to claim 1, wherein said actuator comprises a valve or shutter designed to be remotely controlled.

7. A lost-air stabilising jacket (100) for a diver, comprising a device according to claim 1, connected firstly to a gas bottle (21) for stabilisation and secondly to at least one bag (11, 24) on said stabilising jacket by gas ducts.

8. A closed-circuit recycler for a diver, comprising a device according to claim 1.

9. The device according to claim 1, wherein,
the block of hydrophobic material is electrically non-conductive,
the at least one electronic circuit (52) and a battery (53) are embedded in said block of hydrophobic material,
said battery is an inductive charging battery with inductive charging through at portion of the block of hydrophobic material.

10. The device according to claim 1, further comprising a control panel.

11. The device according to claim 10, further comprising communication means between said electronic circuit and said control panel.

12. The device according to claim 11, wherein said communication means comprise at least one means for transmitting or receiving optical and/or radio and/or acoustic-wave signals.

13. The device according to claim 12, wherein said means of transmitting or receiving optical signals comprise at least one optical socket (56a, 56b, 56c) that emerge on one face of the block of hydrophobic material, the at least one optical socket (56a, 56b, 56c) designed to connect an optical-fibre cable thereto.

14. A lost-air stabilising jacket (100) for a diver, comprising a device according to claim 1, connected firstly to a respiration-gas bottle and secondly to at least one bag (11, 24) on said stabilising jacket by gas ducts.

15. The stabilising jacket according to claim 14, further comprising a control panel, and communication means between the control panel and the electronic circuit, the control panel (23) comprising an optical switch (33) for activating or deactivating a stabilisation function at the expected submersion of said device.

16. The stabilising jacket according to claim 15, wherein said control panel (23) further comprises at least one additional optical switch (29, 30, 31, 32, 34) for activating or deactivating respectively at least one of the following functions of said device:
slow ascent,
rapid ascent,
slow descent, rapid descent,
pause.

17. A device (17, 22) for a diver, comprising:
a block of hydrophobic material;
at least one electronic circuit (52) and a battery (53) designed to supply said circuit,
wherein said circuit and said battery are included in said block of hydrophobic material; and
a pressure sensor (54) located within said block of hydrophobic material,
wherein said block of hydrophobic material transmits a pressure on an external face of said block of hydrophobic material to said pressure sensor.

18. A device (17, 22) for a diver, comprising:
a block of hydrophobic material;
at least one electronic circuit (52) and a battery (53) designed to supply said circuit,
wherein said circuit and said battery are included in said block of hydrophobic material, wherein,
the block of hydrophobic material is electrically non-conductive,
the at least one electronic circuit (52) and a battery (53) are embedded in said block of hydrophobic material,
said battery is an inductive charging battery with inductive charging through at portion of the block of hydrophobic material; and
a pressure sensor (54) embedded within said block of hydrophobic material,
wherein said block of hydrophobic material transmits a pressure on an external face of said block of hydrophobic material to said pressure sensor, and
said block of hydrophobic material includes a first external face and an opposite, second external face, and a duct (57*a*, 57*b*, 57*c*) that passes through said block of hydrophobic material through the first external face, to and through the opposite, second external face, and
said actuator is a motor driving a compressor, said compressor comprising the duct (57*a*, 57*b*, 57*c*) in said block of hydrophobic material (51), a rotor of said motor being housed inside said duct, a stator of said motor being embedded in said block of hydrophobic material.

* * * * *